United States Patent
Smith et al.

(10) Patent No.: US 9,768,084 B1
(45) Date of Patent: Sep. 19, 2017

(54) INLINE MONITORING OF TRANSISTOR-TO-TRANSISTOR CRITICAL DIMENSION

(71) Applicant: GLOBALFOUNDRIES Inc., Grand Cayman (KY)

(72) Inventors: Elliot John Smith, Dresden (DE); Nigel Chan, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/075,378

(22) Filed: Mar. 21, 2016

(51) Int. Cl.
| | |
|---|---|
| *H01L 21/306* | (2006.01) |
| *H01L 21/66* | (2006.01) |
| *H01L 29/423* | (2006.01) |
| *H01L 21/8234* | (2006.01) |
| *H01L 21/84* | (2006.01) |
| *H01L 27/11* | (2006.01) |
| *H01L 27/12* | (2006.01) |

(52) U.S. Cl.
CPC ........ *H01L 22/30* (2013.01); *H01L 21/30604* (2013.01); *H01L 21/823456* (2013.01); *H01L 21/84* (2013.01); *H01L 22/12* (2013.01); *H01L 27/11* (2013.01); *H01L 27/1203* (2013.01); *H01L 29/4236* (2013.01)

(58) Field of Classification Search
CPC ....... H01L 21/30604; H01L 21/823456; H01L 21/84; H01L 22/12; H01L 22/30; H01L 27/11; H01L 27/1203; H01L 29/4236
See application file for complete search history.

(56) References Cited

U.S. PATENT DOCUMENTS

| | | | | |
|---|---|---|---|---|
| 2002/0097405 | A1* | 7/2002 | Kishimura | G01B 11/22 356/625 |
| 2003/0080379 | A1* | 5/2003 | Oikawa | H01L 29/4236 257/331 |
| 2003/0229479 | A1* | 12/2003 | Smith | G06F 17/5068 703/14 |
| 2007/0221619 | A1* | 9/2007 | Cheng | H01L 22/12 216/59 |
| 2010/0006931 | A1* | 1/2010 | Denison | H01L 29/407 257/334 |
| 2011/0156149 | A1* | 6/2011 | Wang | H01L 21/324 257/368 |
| 2016/0225678 | A1* | 8/2016 | Zhou | H01L 22/12 |

* cited by examiner

*Primary Examiner* — Allan R Wilson
(74) *Attorney, Agent, or Firm* — Amerson Law Firm, PLLC (57) ABSTRACT

In one aspect of the present disclosure, a method is provided, the method including providing a test region in an upper surface region of a semiconductor substrate, forming a plurality of trenches in the test region, the trenches of the plurality of trenches having at least one of a varying width, a varying length, and a varying bridge between adjacent trenches, determining depth values of the trenches, and evaluating the risk of defects of gate electrodes to be formed on the basis of the depth values.

16 Claims, 5 Drawing Sheets

INLINE MONITORING OF TRANSISTOR-TO-TRANSISTOR CRITICAL DIMENSION

BACKGROUND OF THE INVENTION

1. Field of the Invention

The present disclosure relates to methods of inline monitoring of transistor-to-transistor critical dimensions (CDs) and test structures, and, more particularly, to a method for estimating the risk of defects of gate electrodes formed in at least one active region.

2. Description of the Related Art

As the semiconductor industry continues pushing the boundaries of Moore's Law, there is a constant drive to scale down the critical dimensions (CDs) of circuit elements of an integrated circuit (IC) in order to increase the functionality of ICs within the smallest footprints. A critical issue that has to be taken into account at advanced scaling is how close rows of arrays of transistors can be stacked upon one another (or with regard to the wafer in two dimensions). This is important because the source and drain of a transistor device are to be completely separated by the gate. In fully-depleted silicon-on-insulator (FDSOI), for example, it is an issue that epitaxially grown raised source/drain regions may be overgrown around the ends of a gate structure, possibly leading to source/drain regions that are not completely separated. Another requirement concerns sufficient spacing between two adjacent gate structures and sufficient overlay between gate structures and active regions. These requirements induce constraints on a closest separation between adjacent transistors by the tip-to-tip (T2T) distance between two adjacent gate structures.

Figure 1:
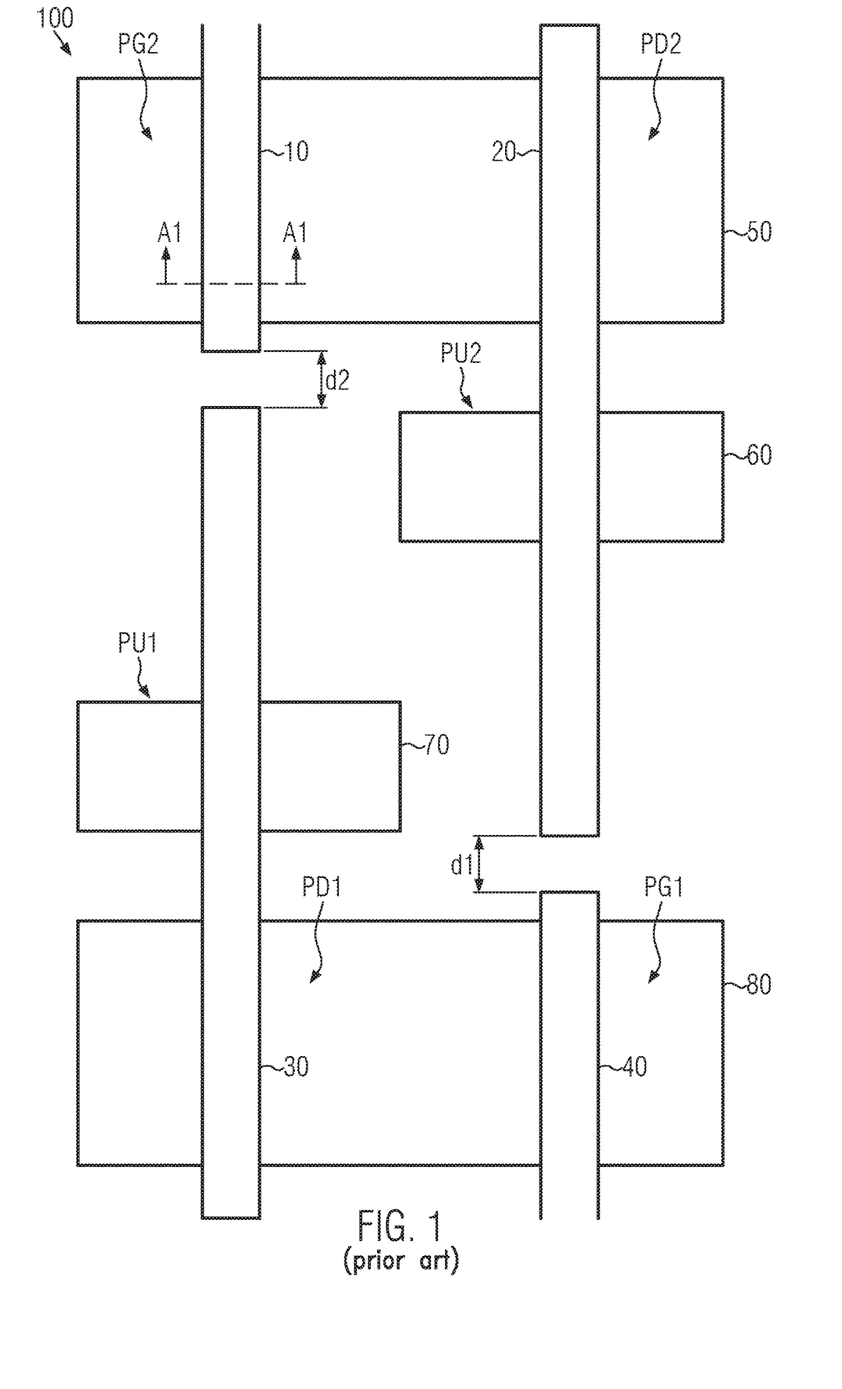
FIG. 1 schematically illustrates a top view of a memory cell structure of the related art.

FIG. 1 schematically illustrates, in a top view, a common prior art SRAM memory cell structure 100 comprising two columns of gate structures 10, 20, 30 and 40, the gate structures 10 and 30 being separated along a length direction by a distance d2, while the gate structures 20 and 40 are oriented in parallel to the gate structures 10 and 30, the gate structures 20 and 40 being separated by a distance d1. Usually, the gate structures 10 and 30 are formed as a single gate structure which is subsequently cut, forming the separated gate structures 10, 30, wherein the cut has the width d2. Similarly, the gate structures 20 and 40 are usually formed as a single gate structure which is subsequently cut, the cut having the width d1.

The cell structure 100 comprises a plurality of active regions 50, 60, 70 and 80 formed in an upper surface region of a semiconductor substrate and being electrically isolated from each other by insulating structures provided in the upper surface of the semiconductor substrate. As illustrated in FIG. 1, the gate structures 10 and 20 overlay the active region 50, wherein the gate structure 20 extends over the active region 60. Similarly, the gate structure 30 overlays the active regions 70 and 80, while the gate structure 40 overlays the active region 80. Upon appropriately contacting the active regions 50 to 80 and the gate structures 10 to 40, transistor device structures PG1, PG2, PU1, PD1 and PD2, PU2 may be connected to implement a six transistor (6T) memory cell, where two cross coupled inverters PU1, PD1 and PU2, PD2 are selectively accessible via pass through transistors PG1 and PG2.

The above described cell structure 100 is conventionally used to push the boundaries of the capability of a semiconductor manufacturing facility by aggressively scaling critical structures and CDs, such as the spacings d1 and d2 in FIG. 1. This allows for the increasing of the dimensions of the active areas 60 and 70 which improve performance and within wafer and die variation.

For example, in case of a poor overlay of the gate structure 10 and the active region 50, as indicated by a broken line in FIG. 1, the broken line indicating an end of the gate structure 10, a bridging may occur when epitaxially growing raised source/drain regions (not illustrated), the epitaxially growing material growing around the end of the gate structure 10 as indicated by an arrow A1 in FIG. 1. It is not difficult to see that the performance of the cell structure 100 depends on the spacings/cuts d1 and d2, because an unclear bridging between either of the gate structures 10, 30 (see arrow A1 in FIG. 1) and 20, 40 may severely impact the performance of the cell structure 100 and may possibly lead to undesired electric connections between neighboring gate structures.

Conventionally, T2T bridging may be detected during the SORT process when fabricating semiconductor devices. However, as SORT takes place at an advanced stage during processing, there are high costs associated with manufacturing wafers which won't yield after the gate all the way down to SORT.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In an aspect of the present disclosure, a method is provided. In accordance with some illustrative embodiments herein, the method includes providing a test region in an upper surface region of a semiconductor substrate, e.g., adjacent to at least one active region, forming a plurality of trenches in the test region, the trenches of the plurality of trenches having at least one of a varying width, a varying length and a varying bridge between adjacent trenches, determining depth values of the trenches, and evaluating the risk of defects of gate electrodes (e.g., of gate electrodes to be formed in the at least one adjacent active region) on the basis of the depth values.

In another aspect of the present disclosure, a test structure is provided. In accordance with some illustrative embodiments herein, the test structure includes a test region formed in an upper surface region of a semiconductor substrate, and an active region formed in the semiconductor substrate adjacent to the test region. The test region may have a plurality of trenches formed therein, the trenches of the plurality of trenches having at least one of a varying width, a varying length and a varying pitch between adjacent trenches. Furthermore, the active region may have at least one semiconductor device formed therein. In accordance with some special illustrative embodiments herein, the test region and the active region may be separated by at least one insulating structure, such as at least one shallow trench isolation.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure may involve, in accordance with some illustrative embodiments of the present disclosure, the fabrication of semiconductor devices structures, such as a plurality of MOSFET or MOS devices integrated on a chip. When referring to MOS devices, the person skilled in the art will appreciate that, although the expression "MOS device" is used, no limitation to a metal-containing gate material and/or to an oxide-containing gate dielectric material is intended. Accordingly, a semiconductor device structure may be understood as comprising at least two MOS devices of at least one of a P-type and an N-type.

Semiconductor devices of the present disclosure may concern devices which may be fabricated by using advanced technologies, i.e., the semiconductor devices may be fabricated by technologies applied to approach technology nodes smaller than 100 nm, for example, smaller than 50 nm or smaller than 35 nm, e.g., at 22 nm or below. After a complete reading of the present application, a person skilled in the art will appreciate that, according to the present disclosure, ground rules smaller or equal to 45 nm, e.g., at 22 nm or below, may be imposed. The present disclosure proposes semiconductor devices that may have structures of minimal length dimensions and/or width dimensions smaller than 100 nm, for example, smaller than 50 nm or smaller than 35 nm or smaller than 22 nm. For example, the present disclosure may provide semiconductor devices fabricated by using 45 nm technologies or below, e.g., 22 nm or even below.

The person skilled in the art will appreciate that semiconductor devices may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

The person skilled in the art will appreciate that the expression "SOT" is not intended as being limited to a special technique. In general, an SOT substrate may have an active semiconductor layer disposed on a buried insulating material layer, which, in turn, may be formed on a base substrate material. In accordance with some illustrative embodiments of the present disclosure, the active semiconductor layer may comprise one of silicon, germanium, silicon germanium and the like. The buried insulating material layer may comprise an insulating material, e.g., silicon oxide or silicon nitride. The base substrate material may be a base material that may be used as a substrate as known in the art, e.g., silicon and the like.

In accordance with at least some of the herein disclosed illustrative embodiments employing FDSOI substrates, the active semiconductor layer may have a thickness of about 20 nm or less, while the buried insulating material layer may have a thickness of about 145 nm or, in accordance with advanced techniques, the buried insulating material layer may have a thickness in a range from about 10-30 nm. For example, in some special illustrative embodiments of the present disclosure, the active semiconductor layer may have a thickness of about 3-10 nm.

As to a crystalline plane orientation of the base substrate material, similar to that of an ordinary silicon device, an SOT substrate having a surface with a face (100) may be used. However, in order to improve the performance of a PMOS semiconductor device, a surface of the PMOS semiconductor device may be used as a face (110). Alternatively, a hybrid plane orientation substrate whose surface may be mixed by a face (100) and a face (110) may be used. In alternative embodiments, the base substrate material may be of an N-type when N-accumulation and/or N-inversion devices are considered (otherwise P-type for P-accumulation and/or P-inversion).

Figure 2A:
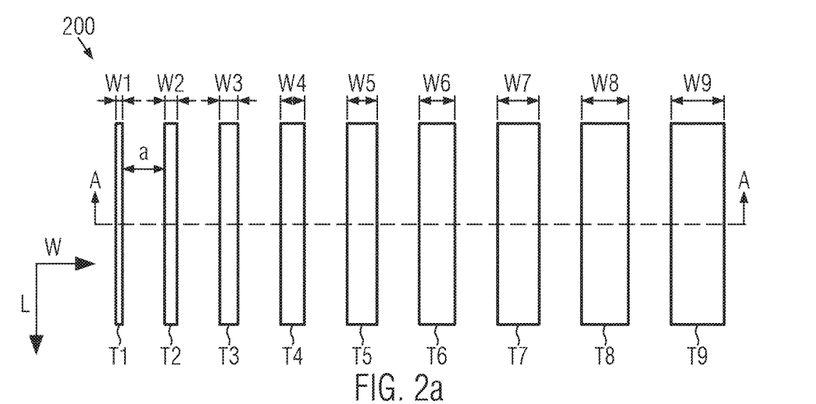
FIGS. 2a-2c schematically illustrate in cross-sectional views a plurality of trenches in accordance with some illustrative embodiments of the present disclosure.

With regard to FIGS. 2a-2c, some illustrative embodiments of the present disclosure are described below. Herein, FIG. 2a schematically illustrates a top view of a test region provided in an upper surface region of a semiconductor substrate, e.g., an FDSOI or bulk substrate comprising a silicon based substrate material. In accordance with some illustrative examples, the test region 200, as illustrated in FIG. 2a, may be located in an upper surface of a semiconductor substrate (reference numeral 210 in FIGS. 2b and 2c) adjacent to at least one active region (not illustrated), e.g., an active region of an SRAM cell (such as the cell structure 100 in FIG. 1), in which a memory function is to be implemented. This does not pose any limitation to the present disclosure and the active region (not illustrated) may be formed for implementing a logic function.

Figure 2B:
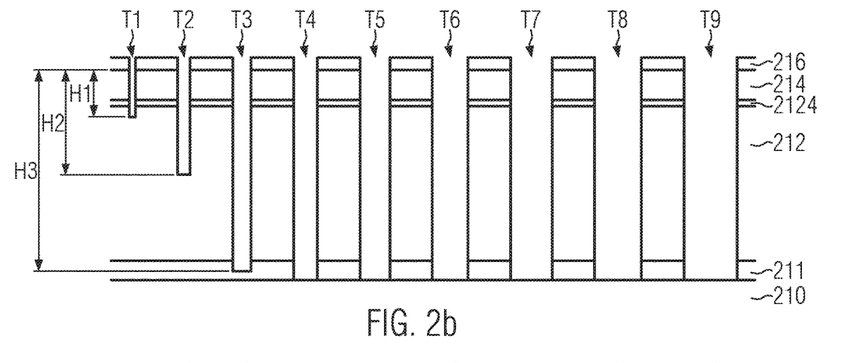
Figure 2C:
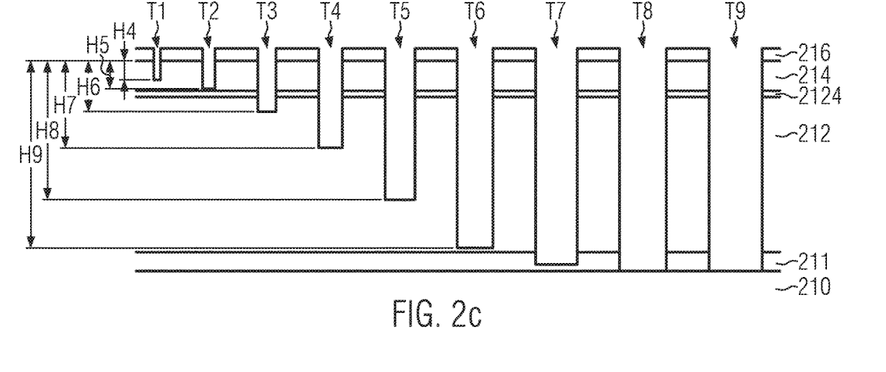

FIGS. 2b and 2c schematically illustrate cross-sectional views along the line A-A in FIG. 2a.

With regard to FIGS. 2a-2c, a plurality of trenches T1 to T9 are schematically illustrated, the plurality of trenches T1 to T9 being formed in the test region 200. Each of the trenches T1 to T9 has an associated width dimension W1 to W9 along a width direction W and all the trenches T1 to T9 have equal length dimensions along a length direction L perpendicular to the width direction W. The width dimensions W1 to W9 of the trenches T1 to T9 may vary as indicated in FIGS. 2a-2c, that is, $Wi \neq Wj$, where i, j=1, ..., 9 and $i \neq j$. In accordance with a special illustrative example, the trenches T1 to T9 may be arranged such that W1<W2<W3<W4<W5<W6<W7<W8<W9. However, this does not pose any limitation to the present disclosure and any arrangement, i.e., any permutation among W1 to W9, may be implemented.

In accordance with some illustrative embodiments, the plurality of trenches T1 to T9 may be formed by depositing a layer 211 comprising a gate dielectric material on an upper surface of a semiconductor substrate 210, e.g., an FDSOI substrate or a bulk substrate. Subsequently a gate electrode material layer 212 is formed on the layer 211. In accordance with some optional illustrative embodiments, a thin oxide liner 2124 may be formed on an upper surface of the gate electrode material layer 212. Over the gate electrode material layer 212 (and in case that the oxide liner 2124 is formed, thereon), a hard mask 214, e.g., a nitride hard mask, may be formed. Over the hard mask 214, an oxide hard mask 216 may be formed.

In accordance with some illustrative embodiments of the present disclosure, the stage during fabrication as depicted in FIGS. 2a-2c may correspond to a stage in which cut hard mask openings (not illustrated) may be formed and prior to a final gate etch (not illustrated) in which the oxide hard mask 216 may be removed.

In accordance with some illustrative embodiments of the present disclosure, the trenches T1 to T9 may be formed by performing an anisotropic plasma edge, selectively removing the material layers 214, 212 and 211 in accordance with the oxide hard mask 216. Depending on the anisotropy of the anisotropic plasma edge (not illustrated), depth values of the trenches T1 to T9 may vary in accordance with the associated width dimensions W1 to W9. In accordance with some illustrative examples herein, the anisotropic plasma etch process may comprise a plurality of different etch steps, e.g., etch agents. For example, the material of the hard mask 214 may be selectively removed with regard to the oxide hard mask 216 in a first etching step, optionally using the oxide liner 2124 as an etch stop. Subsequently, the exposed oxide liner 2124 may be removed and the gate electrode material layer 212 may be anisotropically etched in a second and a third etch step, respectively. The etching of the gate electrode material layer 212 may be time controlled, and the gate dielectric 211 may be anisotropically removed to expose upper surface regions of the semiconductor substrate 210.

In accordance with some illustrative embodiments of the present disclosure, the formation of the plurality of trenches T1 to T9 may be at the same time when forming gate structures (not illustrated) in and over adjacent active regions (not illustrated).

FIG. 2b schematically illustrates the cross-sectional view along line A-A in FIG. 2a in accordance with some illustrative embodiments of the present disclosure. For example, the trenches T1 to T9 may have varying depth dimensions, where, for example, a depth value H1 of the trench T1 may be smaller than a depth value H2 of the trench T2, which may be smaller than a depth value H3 of the trench T3. Depth values of the trenches T4 to T9 may be greater than the depth value H3. In accordance with an explicit illustrative example, H1<H2<H3 for the trenches T1 to T3 with respective width dimensions W1 to W3 and equal length dimension.

In accordance with some illustrative embodiments of the present disclosure, the depth values of the plurality of trenches T1 to T9, i.e., the depth values H1, H2 and H3 of the trenches T1 to T3, may be determined in a subsequent process step. In accordance with some illustrative examples herein, the depth values may be determined by employing at least one of scanning electron microscopy (SEM), transmission electron microscopy (TEM), atomic force microscopy (AFM), and contamination free manufacturing (CFM) techniques.

In accordance with some illustrative examples, CFM may be used for cross wafer uniformity monitoring. For example, CFM may perform a scan of at least a portion of an upper surface region of a semiconductor wafer and chiplet/die/care areas may be compared to one another within a wafer or between the wafer and a reference wafer or layout. Accordingly, abnormalities may be picked up when comparing one area of the wafer under observation to a similar area of the wafer in a different location or to a similar area of a reference wafer. In accordance with some illustrative examples, the structure may be designed in such a way that the whole design space may be put on a cliff, where it is unlikely for the smallest features to print/open much at all. This may improve the sensitivity of the entire structure with respect to very small changes in the CD(s) across the wafer under concern. Accordingly, differences may be observed by CFM as defects either through comparing a structure to a known design, or to other structures on the chip.

In accordance with other possibilities, an advanced point inspection (API) could be set up, where specific spots are imaged across the wafer and may then be manually inspected. Such an inspection may be easily performed for qualifying the performance of a tool, such as a process chamber, after a wet cleaning process, for example, in order to visually inspect the number of cuts open at different locations across the wafer.

Figure 6:
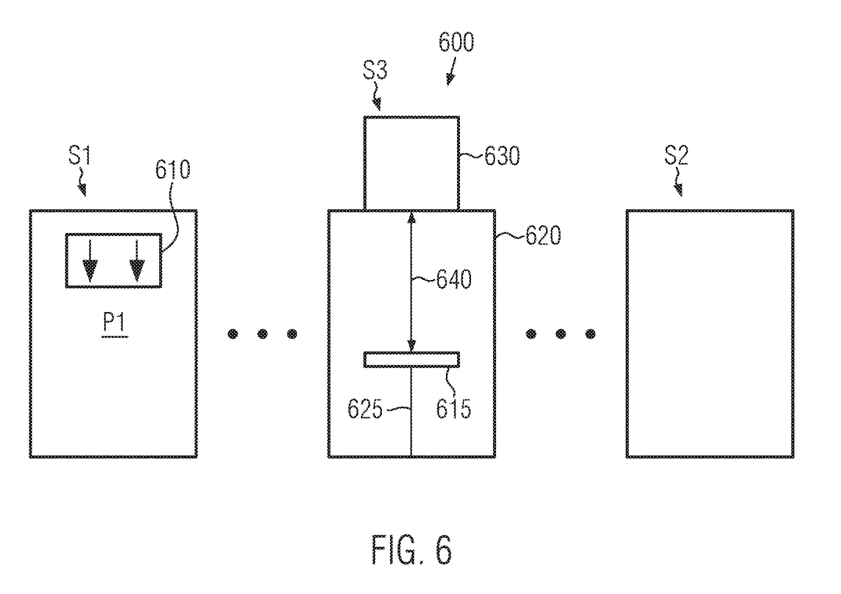
FIG. 6 schematically illustrates different stages during a fabrication process in accordance with some illustrative embodiments of the present disclosure.

FIG. 6 schematically illustrates two stages S1 and S2 during the fabrication of a wafer, where a process sequence 610 is performed at the stage S1 within a process chamber P1. In accordance with some illustrative embodiments of the present disclosure, the process sequence 610 may comprise at least one etching process, e.g., a plasma etch process.

As illustrated in FIG. 6, a wafer inspection device 600 may be located at a stage S3, the stage S3 being sequentially located between the stages S1 and S2. For example, the stages S1 and S2 may be located within front end of line (FEOL) processing, e.g., the stage S1 may be a plasma etch process performed after deposition and patterning of a gate electrode material layer (e.g., layer 212 in FIG. 2b) while the stage S2 may represent a final gate etch completing FEOL processing. The dots in between the stages S1/S3 and the stages S3/S2 may indicate at least one intermediate stage that is not illustrated in detail.

With continuing reference to FIG. 6, the wafer inspection device 600 may comprise a processing chamber 620, within which a semiconductor wafer 615 may be supported by a supporting member 625. A detection device 630, e.g., a microscopy device (SEM, AFM and the like), may be arranged within or at the processing chamber 620 such that the semiconductor wafer 615 may be inspected and monitored during an inspection process 640 by the detection device 630.

In accordance with some illustrative embodiments of the present disclosure, a quantity of the process 610 and/or the process chamber P1 may be evaluated by the wafer inspection device 600 at stage S3 subsequent to stage S1. For example, after completing the process sequence 610, the semiconductor wafer 615 may be transferred from the process chamber P1 to the process chamber 620 of the wafer inspection device 600. Subsequently, the semiconductor wafer 615 may be inspected via the detection device 630 and depth values of a plurality of trenches formed in a test region (e.g. test region 200 as illustrated in FIGS. 2a-2c) may be obtained. On the basis of the depth values, the risk of defect formation, e.g., bridging, may be evaluated during the process sequence 610 and/or processing within the process chamber P1.

In accordance with some illustrative embodiments, it may be decided (based on the result of the evaluation) to include the process chamber P1 and/or the process sequence 610 into the process flow, or to remove the process chamber P1 and/or the process sequence 610 from the process flow, and/or to identify gate structures provided in the process sequence 610 and to remove gate structures from further processing on the basis of the determined depth values.

In accordance with some special illustrative examples, the evaluation may comprise comparing depth values with a predetermined depth limit. For example, depth values that are smaller than the predetermined depth limit may be considered as not deep enough. Accordingly, respective trenches of the plurality of trenches (e.g., T1 to T9 in FIGS. 2a-2c), may be identified as indicating, for example, an unclear bridging, and gate structures having at least one of a width dimension and a length dimension associated with the trench may be considered as defective. As a result, identified gate structures may be removed from further processing and fabrication costs may be lowered. The test structures may also be used to keep a tool in maintenance, never having been brought back into production, for trouble shooting of the issue.

In accordance with some illustrative embodiments of the present disclosure, the stage S3 may be located after a hard mask is formed for cut processing, that is, for cutting a long gate structure into two or more individual gate structures (e.g., gate structures 10, 20 in FIG. 1).

With regard to FIGS. 2a-2c, illustrative embodiments of the present disclosure will be described, wherein the trenches T1 to T9 are arranged in a single row, the row extending along the width direction W.

In accordance with some illustrative embodiments of the present disclosure, the trenches T1 to T9 may have a nominal trench, e.g., T5 may have a nominal width dimension W5, wherein the width dimensions of the trenches T1 to T9 lie in a range of ±50% of the nominal width dimension W5, i.e., a range from 0.5 W5 to 1.5 W5.

Now, reference is made to FIG. 2c. Herein, the trenches T1 to T9 are illustrated in accordance with some illustrative embodiments of the present disclosure, where the process sequence 610 in FIG. 6 and/or the process chamber P1 is evaluated as not being acceptable for the process flow. Particularly, as FIG. 2c shows, the trenches T1 to T6 have depth values H4 to H9 that are smaller than a thickness of the layer stack from layers 214 to 212. Particularly, the trenches T1 to T6 do not extend into the gate dielectric 211, possibly exposing the semiconductor substrate 210. Accordingly, an unclear bridging of gate structures having a separation to adjacent gate structures, in accordance with at least one of the width dimensions W1 to W6, may be expected to occur.

Figure 3A:
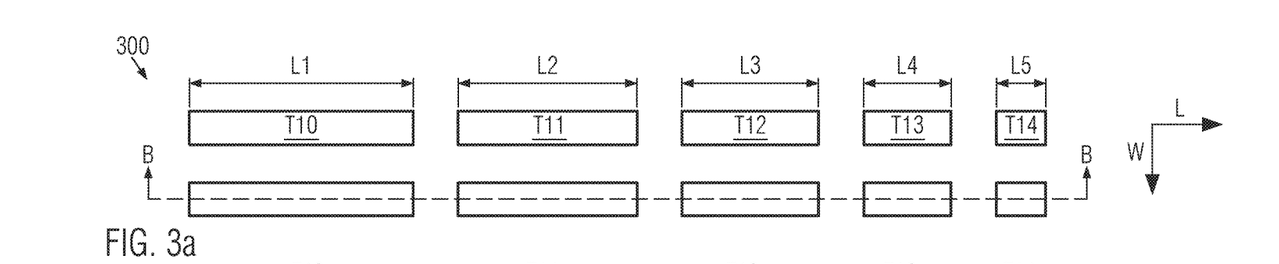
FIGS. 3a-3b schematically illustrate a plurality of trenches in accordance with some illustrative embodiments of the present disclosure.
Figures 3B, 4:
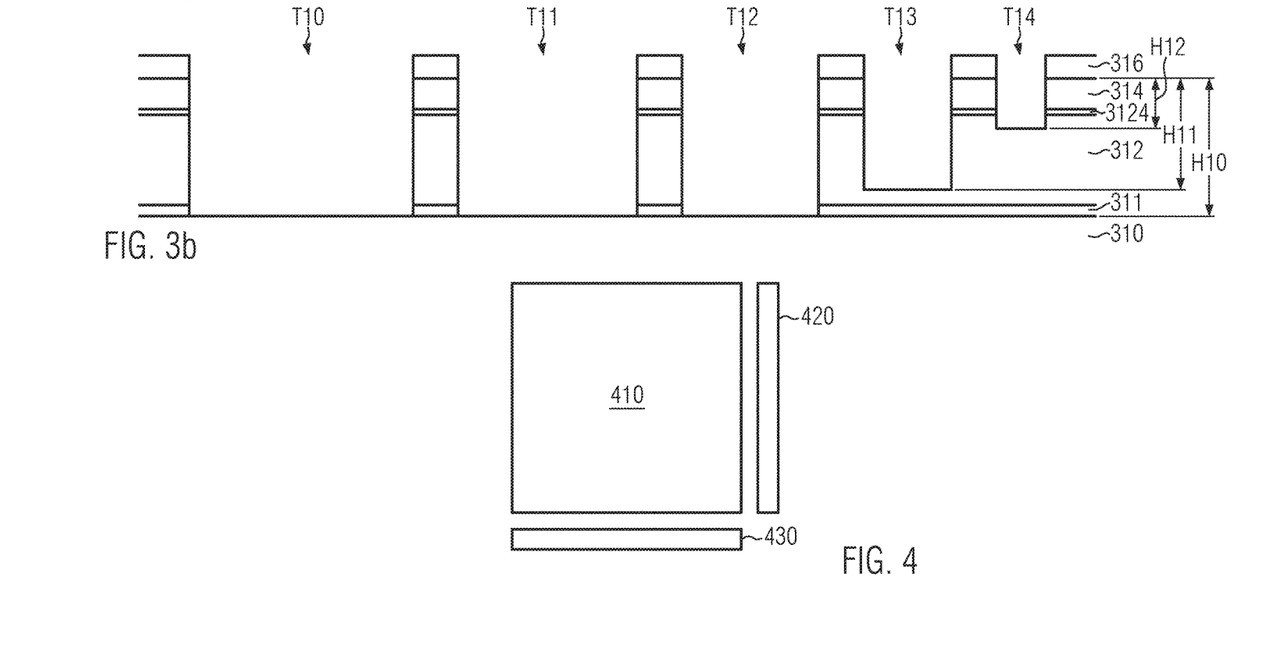
FIG. 4 schematically illustrates a top view of an upper surface region of a semiconductor substrate in accordance with some illustrative embodiments of the present disclosure.

With regard to FIGS. 3a and 3b, alternative embodiments of the present disclosure are schematically illustrated, wherein a plurality of trenches T10 to T14 are formed within a test region 300, the trenches T10 to T14 may have an equal width dimension extending along a width direction W, while showing varying length dimensions along a length direction L perpendicular to the width dimension W. That is, a length dimension L1 of trench T10 is greater than a length dimension L2 of trench T11, greater than a length L3 of trench T12, greater than a length L4 of trench T13, greater than a length L5 of trench T14 (L1>L2>L3>L4>L5).

In accordance with some special illustrative examples herein, the plurality of trenches may be arranged in a matrix scheme having at least two rows, wherein the trenches within each row have varying length, while trenches within the same column have a constant length dimension. With regard to FIG. 3b, a cross-sectional view along the line B-B in FIG. 3a is depicted. Similar to the trenches T1 to T9 above, the trenches T10 to T14 may be formed by performing an anisotropic plasma edge, selectively removing the material layers 314, 312 and 311 in accordance with an oxide hard mask 316. Depending on the anisotropy of the anisotropic plasma edge (not illustrated), depth values of the trenches T10 to T14 may vary in accordance with the associated length dimensions L1 to L5. In accordance with some illustrative examples herein, the anisotropic plasma etch process may comprise a plurality of different etch steps, e.g., etch agents. For example, the material of the hard mask 314 may be selectively removed with regard to the oxide hard mask 316 in a first etching step, optionally using the oxide liner 3124 as an etch stop. Subsequently, the exposed oxide liner 3124 may be removed and the gate electrode material layer 312 may be anisotropically etched in a second and a third etch step, respectively. The etching of the gate electrode material layer 312 may be time controlled, and the gate dielectric 311 may be anisotropically removed to expose upper surface regions of the semiconductor substrate 210.

In accordance with some illustrative embodiments of the present disclosure, the formation of the plurality of trenches T10 to T14 may be at the same time when forming the trenches T1 to T9 and/or gate structures (not illustrated) in and over adjacent active regions (not illustrated).

In accordance with some illustrative embodiments, the trenches T10 to T14 may have varying depth dimensions, where, for example, a depth value H10 of the trenches T10 to T12 may be greater than a depth value H11 of the trench T13, which may be greater than a depth value H12 of the trench T14. The depth values of the trenches T10 to T12 may be a maximum depth at which an upper surface of the substrate 310 is partially exposed through the trenches T10 to T12. In accordance with an explicit illustrative example, H10>H11>H12 for the trenches T10 to T14 with respective length dimensions L1 to L5 and equal width dimension.

The depth value may be determined relative to an upper surface of the layer 214 in FIGS. 2a-2c and 314 in FIGS. 3a-3b. This does not pose any limitation to the present disclosure and any appropriate reference level for determining depth values may be chosen.

In accordance with some illustrative embodiments of the present disclosure, the depth values of the plurality of trenches T10 to T14 may be determined in a subsequent process step as described above, e.g., by employing at least one of SEM, TEM, AFM and CFM.

For example, as a result of an evaluation as described above with regard to FIG. 6, the depth values H10 to H12 may be obtained. Based on the depth values H10, H11 and H12, it may be determined that the trenches T10 to T12 have none or a low risk of causing a defect, e.g., bridging, while the trenches T13 and T14 have a high risk of causing a defect. For example, trenches of dimensions corresponding to any of the trenches T10 to T12 may be evaluated as being acceptable for further processing, while structures of adjacent active regions (not illustrated) having dimensions corresponding to the trenches T13 and T14 may be considered as not acceptable for further processing. Therefore, further processing may be performed by excluding according structures from further processing. Additionally or alternatively, a preceding process or process tool, e.g., the process chamber P1 in FIG. 6, may be removed from future process flows, or maintenance and repair work of the process chamber P1 may be scheduled.

FIG. 4 schematically illustrates a top view of an upper surface of a semiconductor wafer, wherein at least one adjacent active region 410 having at least one semiconductor device formed therein, e.g., at least one MOS transistor device for implementing a logic or memory structure. In accordance with some illustrative embodiments, the active region 410 may comprise an SRAM cell or an SRAM array containing a collection of SRAM cells (similar to the cell 100 in FIG. 1) and the like. In accordance with some illustrative examples, the test regions 420 and 430 may be arranged adjacent to the at least one active region 410. In accordance with some illustrative embodiments of the present disclosure, one of the test regions 420 and 430 may be implemented as the test region 200 depicted in FIG. 2a, while the other of the test regions 420 and 430 may be implemented via the test region 300 of FIG. 3a. Accordingly, gate structures provided within the active region 410 may be evaluated with regard to a risk of causing a defect, such as unclear bridging.

In accordance with some illustrative embodiments of the present disclosure, at least one of the test regions 420 and 430 may be formed as a scrap region that may be cut in a process for cutting dies.

Figure 5:
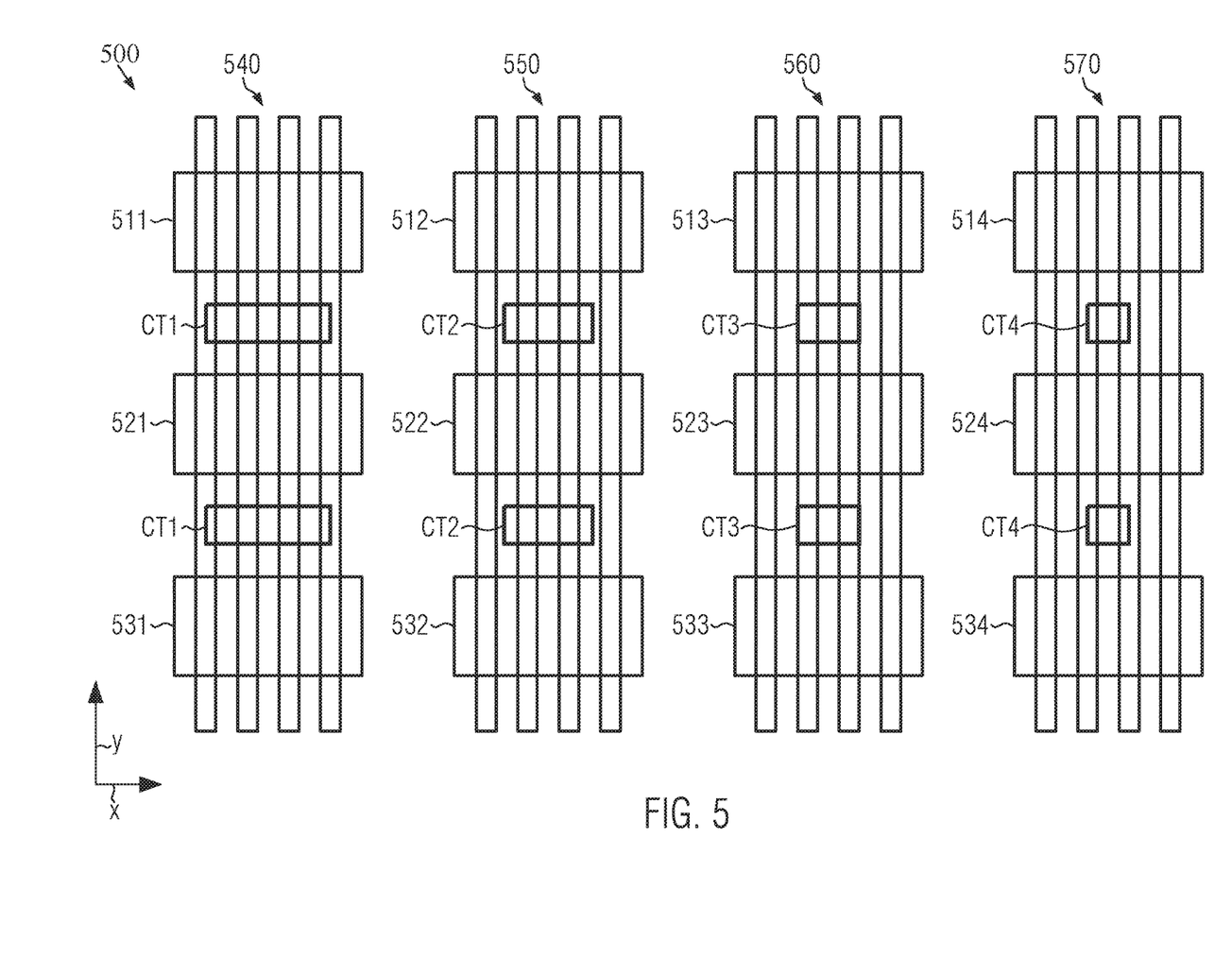
FIG. 5 schematically illustrates a top view of an upper surface of a semiconductor substrate in accordance with some illustrative embodiments of the present disclosure.

FIG. 5 schematically shows in a top view a test region 500 in accordance with some illustrative embodiments of the present disclosure. The test region 500 may comprise an arrangement of active regions 511 to 534 arranged in a matrix arrangement of rows 511, 512, 513, 514, and 521, 522, 523, 524, and 531, 532, 533, 534, and columns 511, 521, 531, and 512, 522, 532, and 513, 523, 533, and 514, 524, 534. The column 511, 521, 531 comprises a plurality of gate structures 540. The column 512, 522, 532 comprises a plurality of gate structures 550. The column 513, 523, 533 comprises a plurality of gate structures 560. The column 514, 524, 534 comprises a plurality of gate structures 570.

The gate structures 540 are to be cut in a cut process in order to form cuts as indicated by reference numeral CT1 in FIG. 5. The gate structures 550 are to be cut in a cut process in order to form cuts as indicated by reference numeral CT2 in FIG. 5. The gate structures 560 are to be cut in a cut process in order to form cuts as indicated by reference numeral CT3 in FIG. 5. The gate structures 570 are to be cut in a cut process in order to form cuts as indicated by reference numeral CT4 in FIG. 5.

According to the embodiment as illustrated in FIG. 5, nominal gate structures having nominal length, nominal width and nominal pitch may be formed, wherein a variation of the cuts CT1, CT2, CT3 and CT4, e.g., having varying dimensions along a direction x (while having equal dimension along direction y; x, y being planar Cartesian coordinates as indicated in FIG. 5) are formed. Accordingly, the quality of a process (e.g., 610 in FIG. 6) corresponding to a cut process may be monitored, based on depth values obtained for the cuts CT1 to CT4 similar to the description above.

In accordance with some illustrative embodiments of the present disclosure, the test region 500 as illustrated in FIG. 5 may be monitored by CFM.

In accordance with some illustrative embodiments of the present disclosure, the test region 500 of FIG. 5 may be used for an electrical testing of gates to gate poly-shorts (open-closed tests).

Although, not explicitly illustrated in FIG. 5, at least one of the width dimension, length dimension and pitch of the gate structures 540 to 570 in FIG. 5 may be varied in accordance with the embodiments as described above with regard to FIGS. 2a-2c and 3a-3b.

In accordance with some illustrative embodiments of the present disclosure, a variation of at least one of a width dimension, a length dimension and a separation/pitch in a test region may vary in accordance with a predetermined function, e.g., a linear function or any other appropriate function.

After a complete reading of the present disclosure, the person skilled in the art will appreciate that the evaluation gained from the test region(s) may be used for how to perform further processing. For example, in accordance with the data of the evaluation, masking patterns may be defined for excluding device structures (e.g., gate structures, transistor structures, etc.), areas and/or regions of the at least one adjacent active regions from further processing, which device structures, areas and/or regions are not acceptable because of possible defect formation, e.g., bridging and the like.

The present disclosure provides, in accordance with at least some of the above-described embodiments, an improved detectability of yield killing defects in line, e.g., a better detectability on the topography of wafers before bringing a process chamber back into production, and/or a better detectability in CD SEM measurements, once a baseline is known, and/or a better detectability using CFM, and/or a better detectability of T2T bridging at SWET in order to avoid processing of scrap material to SORT. Alternatively or additionally, the success of a process sitting on the cliff of being producible may be better evaluated. Alternatively or additionally, at least some of the embodiments of the present disclosure may assist when working on process developments to shrink the T2T distance to more advanced technology nodes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   providing a test region in an upper surface region of a semiconductor substrate;
   forming a plurality of trenches in said test region, said trenches of said plurality of trenches having at least one of a varying width, a varying length and a varying pitch between adjacent trenches;
   determining depth values of said trenches; and
   after forming gate electrodes in said at least one adjacent active region, removing gate electrodes having at least one of a given length, width, and pitch value from further processing, if a depth value of a trench having at least one of said given length, width, and pitch value is smaller than a predetermined depth limit.

2. The method of claim 1, wherein determining said depth values comprises employing at least one of scanning electron microscopy (SEM), transmission electron microscopy (TEM) and atomic force microscopy (AFM).

3. The method of claim 1, wherein forming said plurality of trenches comprises depositing a gate electrode material over said test region and at least one adjacent active region, and exposing said gate electrode material to an etching process in accordance with a gate pattern, wherein said plurality of trenches is formed in said test region, said gate pattern being formed over said test region and said at least one adjacent active region, wherein gate electrodes are formed in said at least one adjacent active region.

4. The method of claim 1, wherein forming said plurality of trenches is formed by an anisotropic etching process within a process chamber, said method further comprising monitoring a performance of said process chamber on the basis of said depth values.

5. The method of claim 1, wherein said depth values are determined in front-end-of-line (FEOL) processing, after gate electrodes are formed in at least one adjacent active region.

6. The method of claim 1, wherein said at least one of said varying width, length, and pitch is varied in accordance with a predetermined function covering width, length and pitch values of gate electrodes to be formed in said at least one adjacent active region.

7. The method of claim 1, wherein said substrate is an SOI substrate having an active semiconductor layer formed over a substrate material, wherein a buried insulating material is formed between said active semiconductor layer and said substrate material.

8. The method of claim 7, further comprising, after forming gate electrodes in said at least one adjacent active region, removing gate electrodes having at least one of a given length, width, and pitch value from further processing, if a depth value of a trench having at least one of said given length, width, and pitch value is smaller than a depth of a trench exposing an upper surface of said buried insulating material.

9. The method of claim 1, further comprising forming an SRAM array or block adjacent to said test region.

10. A method, comprising:
    providing a test region in an upper surface region of a semiconductor substrate, wherein said substrate is an SOI substrate having an active semiconductor layer formed over a substrate material, wherein a buried insulating material is formed between said active semiconductor layer and said substrate material;
    forming a plurality of trenches in said test region, said trenches of said plurality of trenches having at least one of a varying width, a varying length and a varying pitch between adjacent trenches;
    determining depth values of said trenches; and
    after forming gate electrodes in said at least one adjacent active region, removing gate electrodes having at least one of a given length, width, and pitch value from further processing, if a depth value of a trench having at least one of said given length, width, and pitch value is smaller than a depth of a trench exposing an upper surface of said buried insulating material.

11. The method of claim 10, wherein determining said depth values comprises employing at least one of scanning electron microscopy (SEM), transmission electron microscopy (TEM) and atomic force microscopy (AFM).

12. The method of claim 10, wherein forming said plurality of trenches comprises depositing a gate electrode material over said test region and at least one adjacent active region, and exposing said gate electrode material to an etching process in accordance with a gate pattern, wherein said plurality of trenches is formed in said test region, said gate pattern being formed over said test region and said at least one adjacent active region, wherein gate electrodes are formed in said at least one adjacent active region.

13. The method of claim 10, wherein forming said plurality of trenches is formed by an anisotropic etching process within a process chamber, said method further comprising monitoring a performance of said process chamber on the basis of said depth values.

14. The method of claim 10, wherein said depth values are determined in front-end-of-line (FEOL) processing, after gate electrodes are formed in at least one adjacent active region.

15. The method of claim 10, wherein said at least one of said varying width, length, and pitch is varied in accordance with a predetermined function covering width, length and pitch values of gate electrodes to be formed in said at least one adjacent active region.

16. The method of claim 10, further comprising forming an SRAM array or block adjacent to said test region.

* * * * *